United States Patent
Somayajula et al.

(10) Patent No.: US 8,841,950 B2
(45) Date of Patent: Sep. 23, 2014

(54) PULSE WIDTH MODULATION FOR SWITCHING AMPLIFIER

(75) Inventors: Shyam S. Somayajula, Bangalore (IN); Ankit Seedher, Bangalore (IN); Raja J. Prabhu, Bangalore (IN)

(73) Assignee: Ericsson Modems SA, Le Grand-Saconnex (CH)

( * ) Notice: Subject to any disclaimer, the term of this patent is extended or adjusted under 35 U.S.C. 154(b) by 0 days.

(21) Appl. No.: 13/500,575

(22) PCT Filed: Oct. 8, 2010

(86) PCT No.: PCT/IN2010/000668
§ 371 (c)(1),
(2), (4) Date: Jun. 21, 2012

(87) PCT Pub. No.: WO2011/042919
PCT Pub. Date: Apr. 14, 2011

(65) Prior Publication Data
US 2012/0249202 A1  Oct. 4, 2012

(30) Foreign Application Priority Data
Oct. 9, 2009 (IN) .......................... 2100/DEL/2009

(51) Int. Cl.
H03K 3/017 (2006.01)
H03F 1/26 (2006.01)
H03K 7/08 (2006.01)
H03F 3/217 (2006.01)

(52) U.S. Cl.
CPC ............. *H03F 3/2173* (2013.01); *H03F 1/26* (2013.01); *H03K 7/08* (2013.01); *H03F 2200/03* (2013.01); *H03F 2200/351* (2013.01); *H03F 2200/33* (2013.01); *H03F 2200/384* (2013.01)
USPC .......................................... 327/172; 327/175

(58) Field of Classification Search
None
See application file for complete search history.

(56) References Cited

U.S. PATENT DOCUMENTS

| | | | |
|---|---|---|---|
| 7,076,159 B2 * | 7/2006 | Bekker | 388/800 |
| 7,733,170 B2 * | 6/2010 | Cheng | 330/10 |
| 2004/0232979 A1 | 11/2004 | Edwards et al. | |
| 2005/0256670 A1 * | 11/2005 | Bekker et al. | 702/145 |
| 2006/0284677 A1 | 12/2006 | Chang | |
| 2007/0146069 A1 | 6/2007 | Wu | |
| 2007/0279127 A1 * | 12/2007 | Lee | 330/10 |
| 2007/0290726 A1 | 12/2007 | Kaiho et al. | |
| 2008/0129370 A1 * | 6/2008 | Chang et al. | 327/424 |
| 2009/0160547 A1 * | 6/2009 | Shankar et al. | 330/10 |

FOREIGN PATENT DOCUMENTS

| | | |
|---|---|---|
| JP | 2005057519 A | 3/2005 |
| JP | 2009171450 A | 7/2009 |
| WO | 2007090315 A1 | 8/2007 |
| WO | 2007132839 A1 | 11/2007 |

* cited by examiner

*Primary Examiner* — Cassandra Cox
(74) *Attorney, Agent, or Firm* — Coats & Bennett, PLLC

(57) ABSTRACT

A device and a method for implementing pulse width modulation for switching amplifiers (120) is described herein. In one embodiment, the device includes a sampling signal generator (202) to generate a sampling signal (208) and a modulation unit (102) operatively coupled to the sampling signal generator (202). The modulation unit (102) generates differential pulse width modulated waveforms based on the sampling signal (208) and differential input signals (220-1 and 220-2) such that at least one differential pulse width modulated waveform has a duty cycle equivalent to a pre-determined non-zero minimum pulse width at all values of the differential input signals (220-1 and 220-2).

23 Claims, 4 Drawing Sheets

PULSE WIDTH MODULATION FOR SWITCHING AMPLIFIER

TECHNICAL FIELD

The present subject matter relates, in general, to pulse width modulation for switching amplifiers and in particular, to pulse width modulation for class-D amplifiers.

BACKGROUND

Typically, communication devices, for example, wireless cellular phones, include a communication sub-system and an audio sub-system. The communication sub-system includes a transceiver operably coupled to an oscillator while the audio sub-system includes an audio amplifier, such as a switching amplifier, and a modulation unit. The modulation unit, conventionally, works on a duty cycle modulation scheme such as pulse width modulation (PWM) to provide one or more PWM waveforms of an input signal, for example, a speech signal or a music signal. The switching amplifier receives the PWM waveforms from the modulation unit and amplifies them. Further, the switching amplifier provides the amplified PWM waveforms to drive a load such as a speaker.

Generally, the communication sub-system is isolated from an audio sub-system by assembling both the sub-systems on different chips. However, aspects such as cost, size, performance, and power are increasingly characterizing communication devices, and cellular phones in particular. These aspects are feasible only if a high degree of integration is possible. Therefore, instead of having a three-chip or two-chip solution with a few external components, efforts are being made to integrate the communication sub-system and the audio sub-system on a single chip.

Integrating the transceiver and the oscillator onto a single chip along with the switching amplifier is particularly difficult because of a phenomenon called injection locking or frequency pulling, introduced in the oscillator by the switching amplifier, such as a class-D amplifier. Typically, the class-D amplifier is used in audio applications because of its high power efficiency and low power dissipation. During operation, the class-D amplifier drives the modulated waveform to saturation and cut-off modes at a high switching speed, generating a rectangular waveform with fast moving transition edges as an output. Such high switching leads to creation of time varying interference loops. These interference loops vary the operating frequency of the oscillator due to mutual inductive coupling. This phenomenon is referred to as frequency pulling. Frequency pulling may also be observed in two-chip and three chip solutions if the transceiver is in physical proximity to the oscillator.

Due to frequency pulling in the oscillator, the oscillator introduces adjacent spurs in the transceiver, which can demodulate adjacent interfering channels along with the desired channel. The adjacent spurs can also transmit spurious signals in adjacent frequency bands in addition to the desired frequency band, thus, violating the various standards of data transmission.

SUMMARY

This summary is provided to introduce concepts related to a pulse width modulation scheme for switching amplifiers, which is further described below in the detailed description. This summary is not intended to identify essential features of the claimed subject matter nor is it intended for use in determining or limiting the scope of the claimed subject matter.

A device implementing pulse width modulation for switching amplifiers is described. In one embodiment, the device includes a sampling signal generator to generate a sampling signal. The sampling signal generator is operatively coupled to a modulation unit. The modulation unit generates differential pulse width modulated waveforms based on the sampling signal and differential input signals such that at least one differential pulse width modulated waveform has a duty cycle equivalent to a pre-determined non-zero minimum pulse width at all values of the differential input signals.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components. For simplicity and clarity of illustration, elements in the figures are not necessarily to scale.

DETAILED DESCRIPTION

Figure 1:
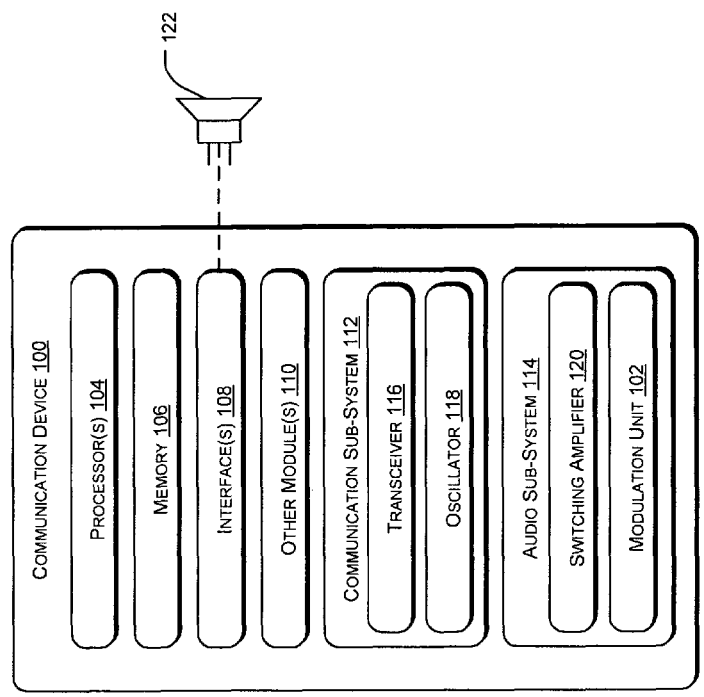
FIG. 1 illustrates a communication device having an exemplary modulation unit, in accordance with an embodiment of the present subject matter.

The disclosed subject matter relates to a pulse width modulation (PWM) for switching amplifiers. Particularly, the subject matter relates to a device and a method for reducing frequency pulling in a voltage-controlled oscillator (VCO) due to time-varying interference loops created by a class-D amplifier.

In a conventional communication device, the communication sub-system is isolated from the audio sub-system by assembling both the sub-systems on different chips. Isolating the two sub-systems minimizes any adverse effects, for example, while communicating data at radio frequencies. However, poor isolation can degrade the adjacent channel protection in either transmit or receive mode of the transceiver or both. For better integration and cost and area/space advantage, it is also desirable to integrate the communication sub-system and the audio sub-system on a single chip. However, due to the proximity of the audio sub-system to the communication sub-system in such cases, mutual inductive coupling between the two sub-systems may cause the oscillation frequency of the conventional oscillator to get skewed. Such a skewing phenomenon is called frequency pulling, injection locking or injection pulling.

A typical audio sub-system includes a modulation unit and a switching amplifier communicatively coupled to a peripheral device such as a speaker. The conventional modulation unit works on a scheme called differential pulse width modulation (DPWM). In DPWM, the input signal Vin is applied in the form of differential input signals, namely, a first differential input signal Vin_p and a second differential input signal Vin_n. The Vin_p and the Vin_n are provided at two input terminals of the conventional modulation unit.

The conventional modulation unit includes a comparator, which compares the Vin_p and the Vin_n, respectively, with a sampling signal having, for example, a triangular waveform. Based on the comparison, the comparator generates duty cycle or pulse width modulated (PWM) waveforms at two output terminals corresponding to the two input terminals of the conventional modulation unit. For a zero valued Vin_p and a zero valued Vin_n, a PWM waveform of 50% duty cycle is generated at the output terminals. For a positive differential input signal Vin, the duty cycle of the PWM waveform corresponding to the Vin_p increases in proportion to an amplitude of Vin_p, while the duty cycle of the PWM waveform corresponding to the Vin_n proportionally decreases. Therefore, a total of 100% duty cycle of the PWM waveforms is maintained across the two output terminals of the modulation unit.

The resulting PWM waveforms from the modulation unit are fed to the switching amplifier to generate a fast switching square wave as an output signal. The switching amplifier can be implemented using a class-D amplifier having transistors configured, for example, in a full-bridge configuration. The transistors, such as n-channel and p-channel MOSFETs, operate as current-steering switches by alternately switching the PWM waveforms between a supply voltage and a ground voltage.

As discussed previously, the output signal from the switching amplifier is a fast switching square wave. Such switching between the supply voltage and the ground voltage creates time-varying interfering loops, which behave as circuits having non-linear or voltage-dependent capacitors and inductors. Also included in the conventional communication device is an oscillator such as an LC-tank VCO. The switching amplifier such as the class D-amplifier is an integral part of the conventional audio sub-system. Due to the proximity of the LC-tank VCO to the class-D amplifier, the time-varying interfering circuits created by the class-D amplifier get coupled to the LC-tank VCO. The mutual inductive coupling between the oscillator, such as LC-tank VCO, and the interfering circuits of the class-D amplifier results in the shift of inductance of the LC-tank VCO from a pre-defined inductance value $L_1$ to an effective inductance value $L_1'$. Similarly, capacitance of the LC-tank VCO can also shift from a pre-defined capacitance value $C_1$ to an effective capacitance value $C_1'$. The effective values of inductance $L_1'$ and $C_1'$ are also time varying because the interfering circuits created by the class-D amplifier are time varying. The shift in $L_1$ and/or $C_1$ causes the LC-tank VCO to produce spurious components at a frequency f' in addition to its oscillation frequency f. This is called injection locking, or frequency pulling, or injection pulling. Mathematically, the aforementioned relationship can be expressed as:

$$|f - f'| = f\left(\frac{L_1' - L_1}{2L_1}\right) \text{ where,} \quad (1)$$

$$f = \frac{1}{\sqrt{L_1 C_1}} \quad (2)$$

The frequency pulling under the influence of mutual inductive coupling of the LC-tank VCO with the interfering circuit of the class-D amplifier, introduces spurs in the output of the LC-tank VCO. Such spurs can de-modulate adjacent stronger interfering channels in addition to the desired channel or can transmit spurs in adjacent frequency bands in addition to the desired frequency band, thus violating various standards on which the communication sub-system of the communication device operates.

Injection locking is particularly significant when the class-D amplifier is idling while the LC-tank VCO and the transceiver need to keep operating. An idling state can be defined as a state when a zero valued Vin_p and a zero valued Vin_n are provided as differential input signals to the audio sub-system. As an example of the idling condition in an implementation of the present subject matter, consider a telephonic conversation in which there are long periods when a person is speaking and there is no speech coming from the other side. Another example of idling condition is when a zero valued Vin is applied at the input of the audio sub-system even though it is powered on.

Due to the idling state of the class-D amplifier, a PWM waveform of 50% duty cycle is generated at the output of the modulation unit using the conventional DPWM scheme. Accordingly, the class-D amplifier switches between the two levels of the supply voltage and the ground voltage, thus again resulting in creation of interfering circuits and frequency pulling thereof. Furthermore, even when the class-D amplifier is not idling, the total number of interference loops is high, thereby causing substantial frequency pulling in non-idling conditions as well.

Another conventional scheme of PWM called uni-polar pulse width modulation deals with the frequency pulling phenomenon by providing either Vin_p or Vin_n. For a zero valued input signal Vin, the modulation unit generates a PWM waveform of zero duty cycle thereby eliminating the frequency pulling in the oscillator. For a positive Vin, a corresponding PWM waveform is generated at the output terminal corresponding to Vin_p, while a PWM waveform having zero duty cycle is generated at the output terminal corresponding to Vin_n. Thus for non-zero input signals also, reduced pulling is achieved. The equivalent average differential output, in such as case, is the same as the conventional DPWM.

The reduced frequency pulling in the uni-polar pulse width modulation scheme is, however, achieved at the cost of data loss for very low amplitude input signals, since PWM waveforms of very narrow pulse widths are obtained for these signals. Such narrow PWM waveforms are difficult to process using driver circuits or post-processing stages, for example class-D amplifiers, following the modulation unit. Hence, such a scheme is usually not used for suppressing the frequency pulling since class-D amplifier performance can get compromised.

A PWM scheme for switching amplifiers is described herein, which significantly reduces frequency pulling in the oscillator with minimum or no effect on amplifier performance. The described PWM scheme can be implemented in an audio sub-system of a communication device. Devices that can implement the disclosed pulse width modulation scheme include, but are not limited to, mobile phones, headphones, earphones, personal digital assistants (PDAs), speakers, computers, and in general, any communication device. In one embodiment, the audio sub-system includes a sampling signal generator, a modulation unit, and a switching amplifier.

The sampling signal generator provides a sampling signal such that a base amplitude is below a common mode signal by a pre-determined non-zero minimum shift value. In one implementation, the base amplitude the lowest amplitude of the sampling signal. The modulation unit is adapted to receive an input signal Vin in a differential form, along with the sampling signal. The modulation unit comprises a set of comparators for comparing the differential input signals with the sampling signal. Another comparator in the modulation unit generate a waveform having a duty cycle equivalent to a pre-determined non-zero minimum pulse width. A combinatorial logic unit within the modulation unit combines the output from the comparators and feeds the resultant as input to the switching amplifier. Further, the switching amplifier differentially drives a load such as a speaker.

As will be discussed in conjunction with the exemplary systems, methods and various embodiments, the PWM waveforms generated by the exemplary modulation unit have a pulse width that is substantially less than the pulse-width obtained from the other differential pulse width modulation schemes known in the art, without affecting the performance of the post-processing stages. This substantially reduces the frequency pulling in the oscillator for both idling and non-idling conditions of the switching amplifier.

Exemplary System

FIG. 1 illustrates a communication device 100 having an exemplary modulation unit 102. The communication device 100 includes processor(s) 104, memory 106, interface(s) 108, other module(s) 110, a communication sub-system 112 and an audio sub-system 114. The communication sub-system 112 includes a transceiver 116 having an oscillator 118 while the audio sub-system 114 includes a switching amplifier 120 and the modulation unit 102. The switching amplifier 120 receives an input signal (Vin) modulated by the modulation unit 102. Generally, the Vin may be received by the modulation unit 102 from an external source. For example, the Vin may be an audio signal from a wireless cellular phone or from a laptop computer.

In one implementation, the Vin is applied in the form of differential inputs, namely, a first differential input signal Vin_p and a second differential input signal Vin_n. The working of the communication device 100 is described herein with reference to certain examples or illustrations. The examples, in no way, should be construed to be limiting. In the description to follow, the communication device 100 is a wireless cellular phone. However, it will be appreciated that the following description extends to any communication device in which a communication sub-system and an audio sub-system are in physical proximity, and in general to any device in which a switching amplifier can cause frequency pulling in an oscillator of the communication device.

The processor(s) 104 can be a single processing unit or a number of units, all of which may include multiple computing units. The processor(s) 104 may be implemented as one or more microprocessors, microcomputers, microcontrollers, digital signal processors, central processing units, state machines, logic circuitries, and/or any devices that manipulate input signals based on operational instructions. Among other capabilities, the processor(s) are configured to fetch and execute computer-readable instructions stored in the memory 106. The memory 106 may include any computer-readable medium known in the art including, for example, volatile memory such as SRAMs and DRAMs and/or non-volatile memory such as EPROMs and flash memories.

Figure 2:
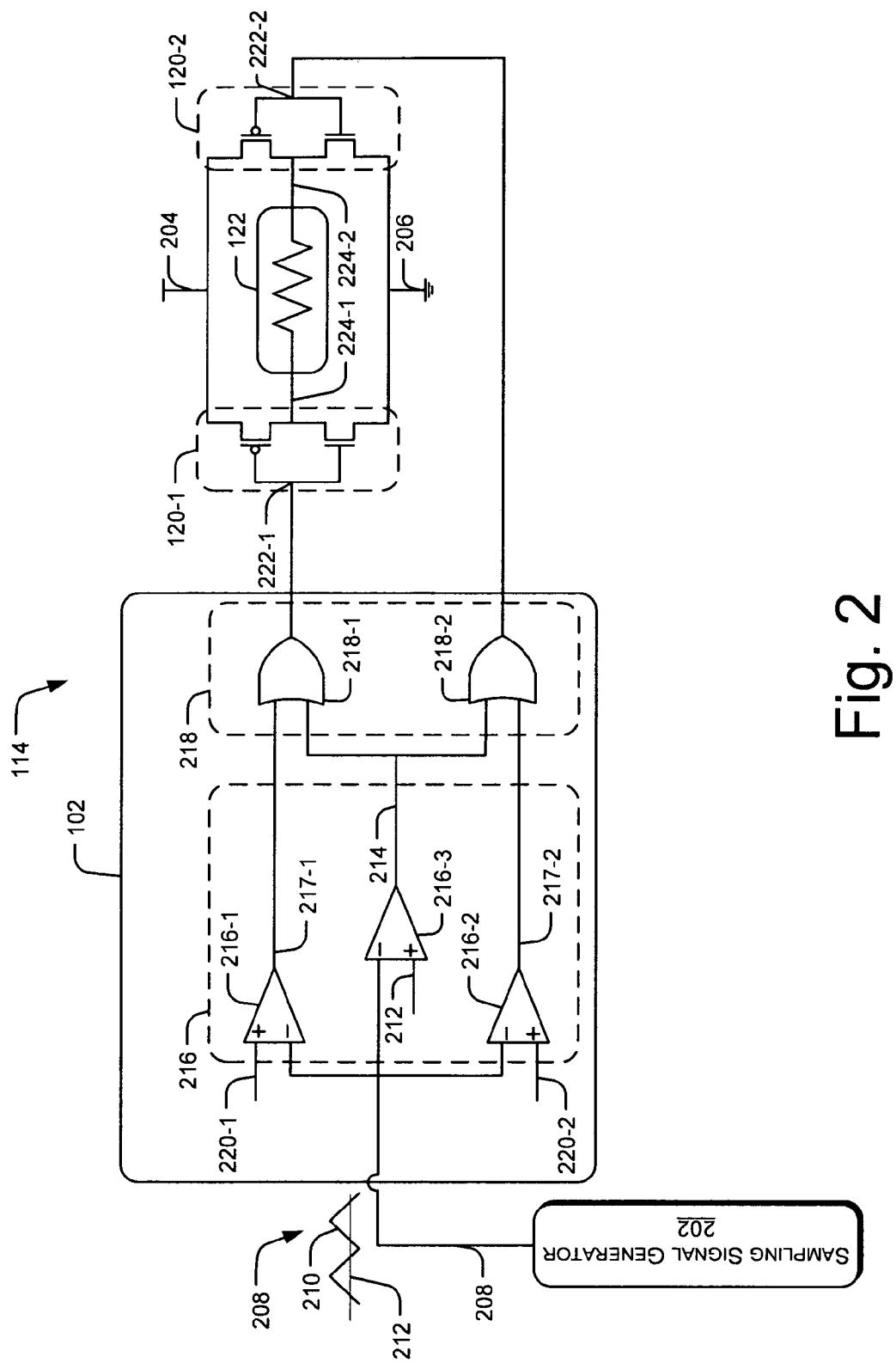
FIG. 2 illustrates an exemplary audio sub-system of the communication device having a switching amplifier and the exemplary modulation unit, in accordance with an embodiment of the present subject matter.

The interface(s) 108 may include a variety of software and hardware interfaces, for example, an interface for peripheral device(s) such as an interface for audio input/output devices, a radio frequency (RF) interface, USB ports, etc. The peripheral device(s) 122, such as a speaker, is operatively coupled to various sub-systems through the interface(s) 108 to facilitate communication in between various sub-systems of the communication device 100. In FIG. 1, the peripheral device(s) 122 is shown external to the switching amplifier 120. However, it should be noted that peripheral device(s) 122 can also be integrated with the audio sub-system 114 as illustrated in FIG. 2. The other module(s) 110 can include programs and modules, such as a power management module, a display module, etc., which supplement applications or functions performed by the communication device 100.

The communication sub-system 112 includes the transceiver 116 and the oscillator 118, besides other components such as a power amplifier (not shown in the figure). In one embodiment, the transceiver 116 is a radio frequency (RF) transceiver and the oscillator 118 is an RF oscillator such as a voltage-controlled oscillator (VCO). The VCO may be implemented as a resonant tank having an inductor in series or in parallel with a capacitor. Such a VCO may interchangeably, be referred to as an LC tank VCO hereinafter.

In operation, the transceiver 116 receives base band information signals from a base station and modulates the baseband information signals by adding an RF carrier signal to them. In one implementation, the modulation of the baseband information signal is in accordance with a particular wireless communication standard. Such an RF modulation results in generation of RF signals. The transceiver 116 removes the RF carrier frequency from the RF signals and demodulates the resulting signals to re-capture the transmitted data. In one implementation, the transceiver 116 demodulates the resulting signal in accordance with the wireless communication standard that was utilized for modulation.

The audio sub-system 114 includes the switching amplifier 120 and the modulation unit 102. The modulation unit 102 receives a sampling signal and the differential input signals—Vin_p and Vin_n. In addition, the modulation unit 102 may have a comparator unit and a logic unit to provide differential pulse width modulated (PWM) waveforms based on the Vin_p, the Vin_n and the sampling signal. The switching amplifier 120 may be implemented as a class-D amplifier in a full bridge configuration that receives the PWM waveforms from the modulation unit 102. Further, the switching amplifier differentially drives the peripheral device 122 such as the speaker.

In one embodiment, for an idling condition of the switching amplifier 120, i.e., when zero valued Vin_n and Vin_p are provided, the corresponding PWM waveforms from the modulation unit 102 have a duty cycle equivalent to the pre-determined non-zero minimum pulse width (interchangeably referred to as to as min_pulse). The PWM waveform having a duty cycle governed by the min_pulse is referred to as min_pulse waveform. In said embodiment, for non-idling conditions of the switching amplifier 120, the modulation unit 102 generates differential PWM waveforms corresponding to both the Vin_n and the Vin_p.

For a positive input signal Vin, the Vin_p is above a common mode signal and the corresponding output waveform from the modulation unit 102 is a first PWM waveform with a higher duty cycle than the pre-determined non-zero minimum pulse width; whereas the Vin_n is below the common mode signal and the corresponding output waveform is a second PWM waveform that continues to have a duty cycle equivalent to the pre-determined non-zero minimum pulse width.

Alternatively, for a negative input signal Vin, the Vin_n is above the common mode signal and the second PWM waveform has a higher duty cycle than that of the min_pulse waveform, while the first PWM waveform for Vin_p continues to have a duty cycle equivalent to the pre-determined non-zero minimum pulse width. Thus, at any time during the operation of the modulation unit 102, the min_pulse waveform is obtained on at least one of the two outputs corresponding to differential input signals Vin_n and Vin_p. Such an exemplary modulation scheme for reducing the frequency pulling in the oscillator for idling, near-idling, and non-idling conditions of the switching amplifier 120 is referred to as Oscillator-pulling Suppression Modulation Scheme (OSMS).

In one implementation, the min_pulse is determined based on the bandwidth of the driver circuits or post-processing stages, such as the switching amplifier 120, following the modulation unit 102. For example, a larger min_pulse can be required for post processing stages with lower bandwidth. The average differential output of the OSMS is similar to that of the classical DPWM and the conventional uni-polar modulation schemes. However, very low frequency pulling is achieved for idling conditions and significantly lesser pulling is achieved for non-idling conditions as compared to the conventional differential PWM schemes. For very small valued input signals or near-idling conditions also, lesser pulling is observed without any loss of data. Therefore, unlike the uni-polar pulse width modulation scheme, the OSMS ensures that the performance of the communication device 100 is not compromised. The implementation of the modulation unit 102 is described in detail in FIG. 2.

FIG. 2 illustrates the exemplary audio sub-system 114 having the switching amplifier 120 and the exemplary modulation unit 102 for reducing frequency pulling in the oscillator 118 using the OSMS according to one embodiment.

In said embodiment, the audio sub-system 114 includes the modulation unit 102, the switching amplifier 120, and a sampling signal generator 202. The sampling signal generator 202 can be an integrator that integrates a square waveform to provide a sampling signal having a ramp waveform or can be, in general, any self-oscillating ramp generator. The switching amplifier 120 is a switching amplifier or a driver circuit for the peripheral device(s) 122 such as a speaker. The switching amplifier can be implemented as a class-D amplifier in a full-bridge configuration having two half-bridge stages namely, for example, switching amplifier 120-1 and 120-2, respectively, to drive the speaker 122 differentially.

The full-bridge configuration of the switching amplifier 120 operates by alternating the conduction path through the speaker 122. The switching amplifier 120 switches the output between two levels defined by a supply voltage $V_{DD}$ 204 and a ground voltage 206, thereby amplifying the PWM waveforms received from the modulation unit 102. Such amplified waveforms obtained from the audio sub-system 120 may be fed to a low pass filter (not shown in the figure) to filter out a sampling signal 208 and recover the input signal Vin. The resulting amplified audio signal drives the peripheral device(s) 122. A filter-less class-D amplifier circuit in which a low pass filter is eliminated can also be used as both the speaker and human ears are inductive in nature and have the ability to re-construct the amplified audio signal received from the switching amplifier 120.

Conventionally, the sampling signal generator generates a sampling signal such as a ramp waveform centered about a common mode signal. However, in said embodiment, a sampling signal 208 can have a ramp waveform 210 or a sawtooth waveform that is not centered about a common mode signal 212. In one implementation, the sampling signal generator 202 generates the sampling signal 208 such that a base amplitude of the sampling signal 208 is lower than the common mode signal 212 by a value equivalent to a pre-determined non-zero minimum shift value, hereinafter referred to as min_shift. The base amplitude is taken as the lowest amplitude of the sampling signal 208 and is hereinafter interchangeably referred to as the lowest amplitude.

To generate the sampling signal 208 from a classical sampling signal centered about the common mode signal 212, the classical sampling signal is flipped over such that the flipped sampling signal has at least twice the frequency of the classical sampling signal. Further, the flipped sampling signal is shifted below the common mode signal 212 by an amount equivalent to the min_shift value, thus resulting in the sampling signal 208. It will be understood that the sampling signal 208 may be generated directly without starting from a classical sampling signal.

In operation, on comparison of the sampling signal 208 with the common mode signal 212, a waveform with a duty cycle equal to a pre-determined minimum pulse width or min_pulse, also referred to as min_pulse waveform 214, is obtained. In an implementation, the min_pulse is determined based on the frequency of the sampling signal 208 and the bandwidth of the driver circuits/post-processing stages following the modulation unit 102, such as switching amplifier 120. If the switching amplifier 120 switches quickly and the bandwidth of the switching amplifier 120 is substantially large, a substantially small value of the min_pulse is selected. Similarly, if the switching amplifier 120 switches slowly and the bandwidth of the switching amplifier 120 is substantially large, a substantially large value of the min_pulse is selected. In effect, the selected min_pulse is sufficient to process a substantially low amplitude Vin without causing any loss of data, which was a drawback of the conventional uni-polar modulation scheme.

In one implementation, the value of the min_pulse is a non-zero percentage of the ramp waveform 210 and is pre-set during design based on an estimated bandwidth of the post-processing stages. For example, if the post-processing stages have a bandwidth of say 15 MHz, then the post-processing stages may process modulated Vin signal as thin as 100 ns. Therefore, for a sampling signal 208 having a frequency of about 500 Khz, a 5% min-pulse may be chosen. This example has been provided to illustrate one implementation of the present subject matter and should not be construed to limit the scope of present subject matter. It is evident that many combinations of bandwidth, frequency and values of min_pulse determined therefrom will be apparent to those skilled in the art.

Further, the min_shift of the sampling signal 208 is determined based on the duty cycle of min_pulse waveform 214. For example, min_shift can be computed by taking a product of the slope of the ramp waveform 210 with the pre-determined non-zero minimum pulse width or min_pulse. In this fashion, the sampling signal 208 riding on the common mode signal 212 is generated and provided to the modulation unit 102.

In said embodiment, the modulation unit 102 further includes a comparator unit 216 and a logic unit 218. The comparator unit 216 includes a plurality of comparators such as comp 216-1, comp 216-2, and comp 216-3. The comparators are implemented using operational amplifiers in one example. The comparator unit 216 provides comparator waveforms resulting from the comparison between Vin and the sampling signal 208, and the sampling signal 208 and the common mode signal 212. The comp 216-1 generates a first comparator waveform 217-1, the comp 216-2 generates a second comparator waveform 217-2 and the comp 216-3 generates the min_pulse waveform 214. The logic unit 218 has one or more logic gates such as OR gates, NOR gates, etc. For example, OR 218-1 and OR 218-2 may be used for combining the comparator waveforms 217-1/217-2 received from the comparator unit 216 with the min_pulse waveform 214. The logic unit 218 ensures that, corresponding to the input signal Vin, at least one input to the switching amplifier 120 receives a min_pulse waveform 214.

In one embodiment, the modulation unit 102 is configured to receive the input signal Vin 220 shown in the figure as differential input signals, namely Vin_p 220-1 and Vin_n 220-2. The first differential input signal Vin_p 220-1 and the second differential input signal Vin_n 220-2 are applied at the two input terminals of the modulation unit 102. Based on the received Vin_p 220-1 and Vin_n 220-2, the modulation unit 102 provides differential pulse width modulated (PWM) waveforms at output pins OUTP 222-1 and OUTN 222-2, respectively.

For this, the sampling signal 208 having the ramp waveform 210 riding on the common mode signal 212 is applied at a first inverting input of the comp 216-1 and also to a first inverting input of the comp 214-2. A second non-inverting input of the comp 216-1 receives the Vin_p 220-1 and a second non-inverting input of the comp 216-2 receives the Vin_n 220-2. The sampling signal 208 is also fed to a first inverting input of the comp 216-3. A second non-inverting input of the comp 216-3 receives the common mode signal 212 as a reference signal to generate the PWM waveform having a duty cycle equal to min_pulse, i.e., the min_pulse waveform 214. The min_pulse waveform 214 is fed to the logic unit 218 as a second input to the OR 218-1 and as a second input to the OR 218-2.

A first input of the OR 218-1 receives the first comparator waveform 217-1. Similarly, the second comparator waveform 217-2 is fed as a first input to the OR 218-2. The logic unit 218 generates output PWM waveforms, namely a first PWM waveform and a second PWM waveform corresponding to the first and the second comparator waveforms 217-1 and 217-2, and the min_pulse waveform 214. The first PWM waveform is obtained at the OUTP 222-1 and the second PWM waveform is obtained at the OUTN 222-2.

In operation, when a zero valued Vin is applied, i.e., zero valued Vin_p 220-1 and Vin_n 220-2 are applied, the generated first comparator waveform 217-1 and the second comparator waveform 217-2 are equivalent to min_pulse waveform 214. The logic unit 218 combines the min_pulse waveform 214 from the comp 216-3 with the first comparator waveform 217-1 to provide min_pulse waveform 214 at the OUTP 222-1. Similarly, the logic unit 218 combines the min_pulse waveform 214 from the comp 216-3 with the second comparator waveform 217-2 to generate a min_pulse waveform 214 at OUTN 222-2.

For positive Vin, corresponding to the time-varying Vin 220 such that Vin_p 220-1 is above the common mode signal 212 and the Vin_n 220-2 is below the common mode signal 212, a first comparator waveform 217-1 is a pulse width waveform with variable duty cycle while the second comparator waveform 217-2 corresponding to a non-zero Vin_n 220-2 is either a zero duty cycle PWM waveform or a PWM waveform with a duty cycle less than min_pulse. The combinatorial logic of the logic unit 218 results in the first PWM waveform at the OUTP 222-1 having a duty cycle that is greater than min_pulse and has a new value based on the amplitude of the non-zero Vin_p 220-1. The second PWM waveform from the logic unit 218 at the OUTN 222-2, corresponding to the non-zero time varying Vin_n 220-2, is a min_pulse waveform.

Similarly, for a negative Vin value, the second PWM waveform from the logic unit 218 at the OUTN 222-2, corresponding to the non-zero time varying Vin_n 220-2, has a duty cycle that is greater than min_pulse and has a new value based on the amplitude of the non-zero Vin_n 220-2. Whereas, the first PWM waveform at the OUTP 222-1 corresponding to the Vin_p 220-1, is a min_pulse waveform. This is illustrated in the subsequent figures.

The first and second PWM waveforms obtained at the OUTP 222-1 and the OUTN 222-2 are applied at the inputs of the switching amplifiers 120-1 and 120-2. The switching amplifier 120-1 provides a first output signal at a first output terminal OUTP_A 224-1 of the switching amplifier 120-1 and a second output signal on a second output terminal OUTN_A 224-2 of the switching amplifier 120-2. An average differential signal, which is the difference between the first and the second output signals, obtained at the OUTP_A 224-1 and the OUTN_A 224-2 drives the peripheral device(s) 122. There can be additional post-processing stages or driver circuits besides the switching amplifier 120 for the peripheral device(s) 122, as will be understood by a person skilled in the art.

Figure 3:
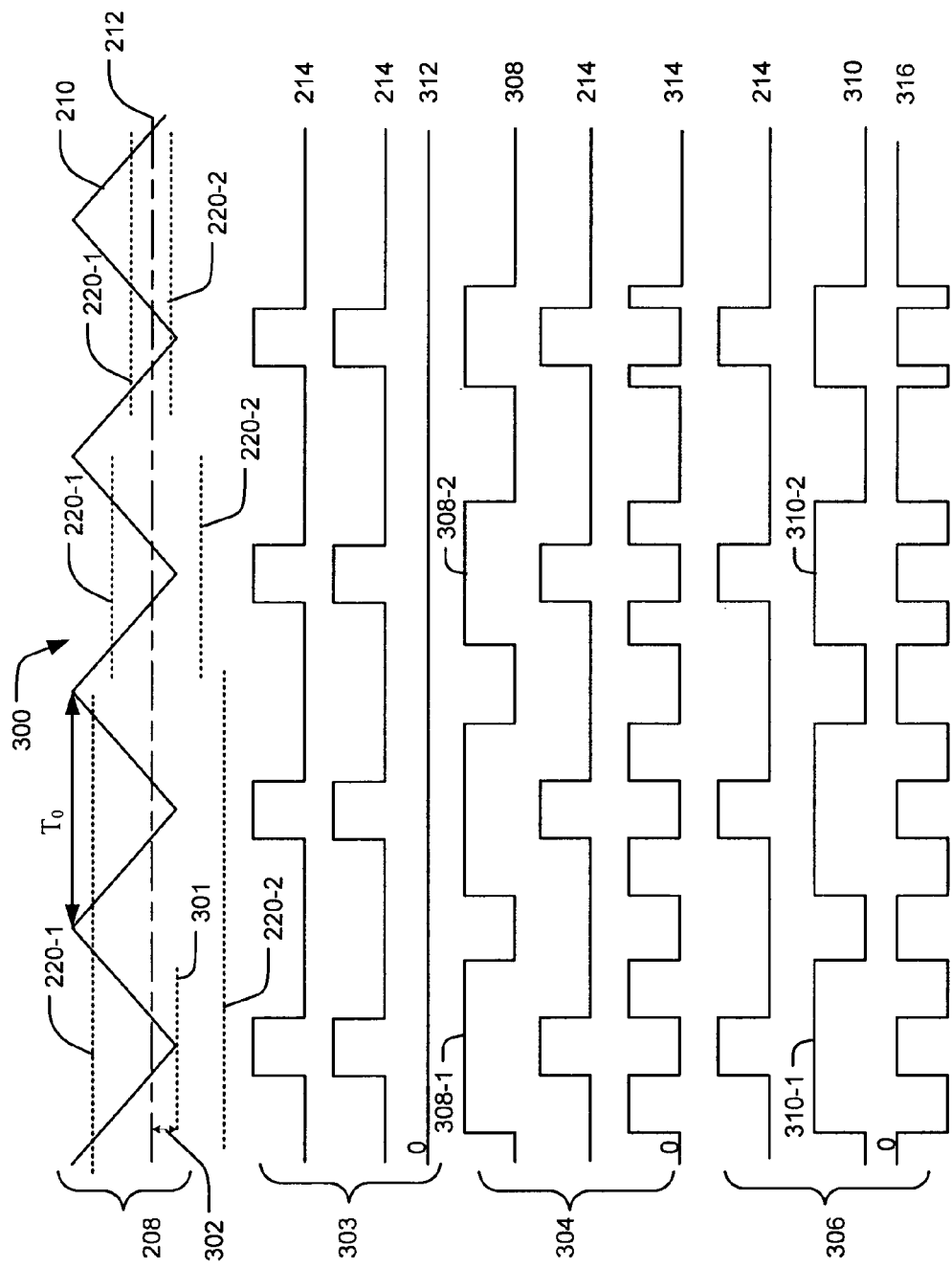
FIG. 3 illustrates exemplary timing diagrams of an input signal and pulse width modulation of the same using the modulation unit, in accordance with an embodiment of the present subject matter.

FIG. 3 illustrates exemplary timing diagrams 300 of the input signal Vin 220 and its pulse width modulation using the sampling signal 208 having, for example, the ramp waveform 210, and a common mode signal 212. The timing diagrams 300 are shown as snapshots of the Vin 220 in time. In one embodiment, the Vin 220 is a differential input signal, such as the Vin_p 220-1 and the Vin_n 220-2, applied at a pair of input terminals of the modulation unit 102. In an embodiment, the Vin 220 is a speech signal having a sinusoidal waveform such that the frequency of the Vin 220 is substantially less than the sampling signal 208. For a sinusoidal waveform, in the positive cycle, Vin_p 220-1 is above the common mode signal, while in the negative cycle, Vin_n 220-2 is above the common mode signal. In other embodiments, the Vin 220 can correspond to other kinds of audio signals such as music signals.

As mentioned before, in one embodiment, the sampling signal 208 is generated such that a base amplitude 301 of the sampling signal 208 is below the common mode signal 210 by a min_shift value 302. The value of the min_shift 302 depends on, for example, min_pulse and the slope of the ramp waveform 210. The total time period of sampling signal is $T_0$. In another embodiment, the sampling signal 208 can be generated from a sampling signal generator used for generating classical sampling signals, as illustrated in FIG. 2. The time period of the classical sampling signal used for generating a sampling signal of time period $T_0$ would be $2T_0$.

The timing diagrams 300 represent various combinations of the Vin_p 220-1 and the Vin_n 220-2 when applied to the modulation unit 102. The combinations include both the idling condition of the switching amplifier 120 when both the Vin_p 220-1 and the Vin_n 220-2 are zero valued, and the non-idling condition of the switching amplifier 120 when the Vin_p 220-1 and the Vin_n 220-2 are non-zero. For discussion purposes, the timing diagrams 300 are described with respect to three kinds of events: 303, 304 and 306. Event 303 occurs during the idling condition at zero valued Vin_p 220-1 and Vin_n 220-2. Event 304 occurs when a time-varying positive Vin is applied, i.e Vin_p 220-1 is above the common mode signal 212 and Vin_n 220-2 is below the common mode signal 212. Event 306 occurs when a time-varying negative Vin is applied, i.e the Vin_n 220-2 is above the common mode signal 212 while the Vin_p 220-1 is below the common mode signal 212. It can be appreciated that the examples using numerical values are only to illustrate the exemplary operation and should not be considered as limiting.

For Event 303, the switching amplifier 120 is idling, which means that a zero valued Vin 220 and therefore a zero valued Vin_p 220-1 and Vin_n 220-2 are applied at both the input terminals of the modulation unit 102 (Vin not shown in figure for this event). Based on the comparison of the zero valued Vin_p 220-1 with the sampling signal 208, the first PWM waveform of a duty cycle of the min_pulse, i.e., the min_pulse waveform 214, is obtained at the OUTP 222-1. Similarly, based on the comparison of the zero valued Vin_n 220-2 with the sampling signal 208, a second PWM waveform of a duty cycle of the min_pulse, i.e., the min_pulse waveform 214, is obtained at the OUTN 222-2. The two modulated waveforms obtained at the OUTP 222-1 and the OUTN 222-2 are subsequently applied to a driver circuit, such as the switching amplifier 120.

The switching amplifier 120 switches the transistors between voltage supply, the $V_{DD}$ 204, and the ground voltage 206, according to the modulated waveforms at the OUTP 222-1 and the OUTN 222-2. The first output waveform and the second output waveform from the switching amplifiers 120-1 and 120-2 at OUTP_A 224-1 and OUTN_A 224-2, are amplified forms of the PWM waveforms received at the OUTP 222-1 and the OUTN 222-2. The difference of the two output waveforms at OUTP_A 224-1 and OUTN_A 224-2 is used to drive the speaker 122. In an idling condition, the difference of the two output waveforms from the switching amplifier 120 yields an average differential output signal DIFF 312. The DIFF 312 is a zero output waveform for the event 303.

The event 304 illustrates the PWM waveforms when a time-varying Vin_p 220-1 and a time-varying Vin_n 220-2 are applied such that Vin_p 220-1 is above the common mode signal 212 and the Vin_n 220-2 is below the common mode signal 212, as shown in the figure along with the sampling signal 208. For the purpose of explanation, the Vin_p 220-1 is illustrated as first having a large amplitude and then as having a relatively small amplitudes at different points in time. The Vin_n 220-2 also varies with time in a similar fashion. For example, first a mid-positive signal or 50% Vin_p 220-1 followed by a second 12.5% Vin_p 220-1, and a third 4% Vin_p 220-1 is applied to the modulation unit 102.

When event 304 occurs, the modulation unit 102 compares the Vin_p 220-1 and the Vin_n 220-2 with the exemplary sampling signal 208. The comparison of Vin_p 220-1 and the sampling signal 208 results in generation of the first comparator waveform 217-1 having a large duty cycle for a large amplitude input signal and a small duty cycle for a small amplitude input signal. On combining the first comparator waveform 217-1 with the min_pulse waveform 214 in the logic unit 218, the first PWM waveform 308 is obtained at the OUTP 220-1 having a time varying duty cycle. The comparison of Vin_n 220-2 and the sampling signal 208 results in generation of the second comparator waveform 217-2 that has a zero duty cycle or a duty cycle less than that of the min_pulse waveform 214. This is because the Vin_n 220-2 is below the common mode signal 212. On combining the second comparator waveform 217-2 with the min_pulse waveform 214 in the logic unit 218, the second PWM waveform is obtained at the OUTN 222-2 having a duty cycle equivalent to the pre-determined minimum non-zero pulse width. For example, for a 50% Vin_p 220-1, the duty cycle of the first PWM waveform 308-1 at the OUTP 222-1 increases from the duty cycle of the min_pulse waveform 214, say 5%, in an idling condition to 55% duty cycle. Similarly, for a Vin_p 220-2 of 12.5%, the duty cycle of the first PWM waveform 308-2 at the OUTP 222-1 is 17.5%. On the other hand, for the time varying Vin_n 220-2, the second PWM waveform at the OUTN 222-2 has a duty cycle of 5% as observed in the idling condition, and hence, a min_pulse waveform 214 is obtained.

However, as discussed before, the difference of the differential PWM waveforms 308 and 214, after being amplified by the respective switching amplifier 120-1 and 120-2, is fed to the speaker 122. The difference between the two signals in the event 306 results in DIFF 314. The pulse width of the DIFF 314 varies in accordance with the value Vin_p 220-1. As compared to the conventional PWM schemes, the average differential output as generated according to the present subject matter is the same. However, due to reduction in the duty cycle of the first PWM waveform 308 in the event 304 of the present system, reduced frequency pulling is observed as compared to a conventional audio sub-system. For example, in a conventional sub-system, for a mid-positive input signal Vin_p, the first PWM waveform would have a duty in cycle of 75%. Whereas, accordance to the present subject matter, the first PWM waveform 308-1 having a duty cycle of 55% is obtained. Additionally, even substantially small amplitude positive signals get processed without loss of data.

The event 306 can be understood in a manner similar to the event 304. In one implementation, the event 306 illustrates the PWM waveforms when a time-varying Vin_n 220-2 and Vin_p 220-1 are applied. In this scenario, the Vin_p 220-1 is below the common mode signal 212 while the Vin_n 220-2 is above the common mode signal (Vin not shown in the figure for this event). For the purposes of explanation, the Vin_n 220-2 can start as a large amplitude Vin_n 220-2 and reduce to relatively small amplitudes at different points in time. The Vin_p 220-1 also varies with time in a similar fashion.

For example, first a mid-negative signal or 50% Vin_n 220-2 is applied, followed by a second 12.5% Vin_n 220-2, and a third 4% Vin_n 220-2. The comparison of Vin_p 220-1 and the sampling signal 208 results in generation of the first comparator waveform 217-1 that has a zero duty cycle or a duty cycle less than the min_pulse waveform 214. This is because the Vin_p 220-1 is below the common mode signal 212. On combining the first comparator waveform 217-1 with the min_pulse waveform 214 in the logic unit 218, the first PWM waveform is obtained at the OUTP 222-1 as the min_pulse waveform 214. On the other hand, the comparison of Vin_n 220-2 and the sampling signal 208 results in generation of the second comparator waveform 217-2 having a large duty cycle for a large amplitude input signal and a small duty cycle for a small amplitude input signal. On combining the second comparator waveform 217-2 with the min_pulse waveform 214 in the logic unit 218, the second PWM waveform 310 is obtained at the OUTP 220-2. For said example, for a Vin_n of 50%, the duty cycle of the second PWM waveform 310-1 at OUTN 222-2 increases from 5% to 55% duty cycle. Similarly, for a Vin_n 220-2 of 12.5%, the duty cycle of the second PWM waveform 310-2 at OUTN 222-2 is 17.5%. As discussed before, the differential of the two signals 310 and 214 is fed to the speaker 122. The difference between the two signals in the event 306 results in DIFF 316. The pulse width of the DIFF 316 varies in accordance with the value of Vin_n 220-2. Similar to event 304, significantly reduced spur levels in the output of the oscillator 118 are obtained as a result of reduced frequency pulling vis-a-vis conventional differential PWM schemes. A method flow diagram is described subsequently with reference to an embodiment of the present subject matter.

Figure 4:
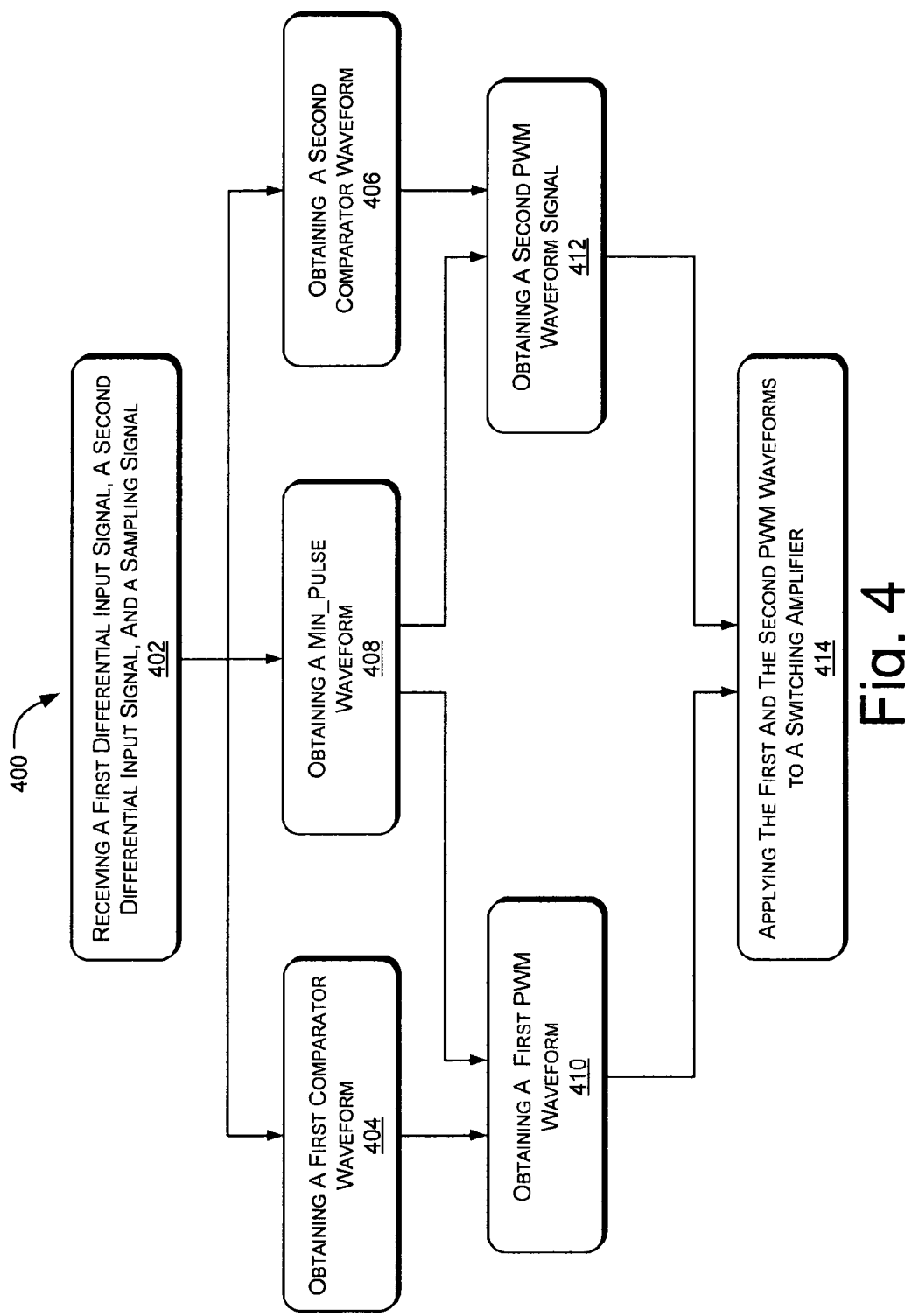
FIG. 4 illustrates an exemplary method for modulating the input signal using an exemplary Oscillator Suppression Modulation Scheme, in accordance with an embodiment of the present subject matter.

FIG. 4 illustrates an exemplary method 400 for modulating the Vin 220 using the exemplary OSMS. The exemplary method may be described in the general context of computer executable instructions. However, the methods are also electronically implementable through analog and digital circuit elements. In one implementation, the instructions are performed by various sub-units of the audio sub-system 114 illustrated in the explanation of FIG. 2.

The order in which the method is described is not intended to be construed as a limitation, and any number of the described method blocks can be combined in any order to implement the method, or an alternative method. Additionally, individual blocks may be deleted from the method without departing from the spirit and scope of the subject matter described herein.

At block 402, a first differential input signal, a second differential input signal, and a sampling signal are received. For example, the modulation unit 102 receives the input signal Vin 220 in the form of two differential input signals, the first differential signal Vin_p 220-1 and the second differential signal Vin_n 220-2. In addition, the modulation unit 102 also receives the sampling signal 208 from the sampling signal generator 202.

In one implementation, the sampling signal generator 202 generates the sampling signal 208 such that the base amplitude 301 of the sampling signal 208 is at a level lower than the common mode signal 212 by a value equivalent to the min_shift 302. The min_shift 302 is determined based at least in part on the min_pulse. To generate the sampling signal 208 from a classical sampling signal centered about the common mode signal 212, the classical sampling signal is flipped over such that the flipped sampling signal has at least twice the frequency of the classical sampling signal. Further, the flipped sampling signal is shifted below the common mode signal 212 by an amount equivalent to the pre-determined non-zero minimum shift value, i.e., min_shift 302, thus resulting in the sampling signal 208. However, it will be understood that the sampling signal 208 can be generated directly as will be easily understood by a person skilled in the art, without using the classical sampling signal.

At block 404, a first comparator waveform is obtained. For the purpose, the modulation unit 102 compares the first differential input signal Vin_p 220-1 with the sampling signal 208 using the comp 216-1 and generates the first comparator waveform 217-1. In operation, when a zero valued Vin is applied, the first comparator waveform 217-1 equivalent to min_pulse waveform 214 is obtained. For positive Vin, corresponding to the time-varying Vin 220 such that Vin_p 220-1 is above the common mode signal 212, the first comparator waveform 217-1 is a pulse width modulated waveform with variable duty cycle.

At block 406, the second comparator waveform is obtained. For example, the modulation unit 102 compares the second differential input signal Vin_n 220-2 with the sampling signal 208 using the comp 216-2 and generates the second comparator waveform 217-2. In operation, when a zero valued Vin is applied, the second comparator waveform 217-2 is equivalent to min_pulse waveform 214. For negative Vin, corresponding to the time-varying Vin 220 such that the Vin_n 220-2 is above the common mode signal 212, the second comparator waveform 217-2 is a pulse width modulated waveform with variable duty cycle.

At block 408, a min_pulse waveform is obtained. In one implementation, the modulation unit 102 compares the common mode signal 212 with the sampling signal 208 using the comp 216-3 and generates the PWM waveform having a duty cycle equivalent to the pre-determined non-zero minimum pulse width or the min_pulse waveform 214.

At block 410, a first PWM waveform is obtained. In one embodiment, when a zero valued Vin is applied, the logic unit 218 combines the min_pulse waveform 214 from the comp 216-3 with the first comparator waveform 217-1 to generate a first PWM waveform equivalent to the min_pulse waveform 214 at the OUTP 222-1. For positive Vin, corresponding to the time-varying Vin 220 such that Vin_p 220-1 is above the common mode signal 212, the logic unit 218 combinatorial logic results in the first PWM waveform 308 having a duty cycle that increases from min_pulse to a new value based on the amplitude of the non-zero Vin 220. Whereas, for negative Vin, the logic unit 218 provides a first PWM waveform equivalent to the min_pulse waveform 214 at the OUTP 222-1.

At block 412, the second PWM waveform is obtained. Similar to the first comparator waveform, when a zero valued Vin is applied, the logic unit 218 combines the min_pulse waveform 214 from the comp 216-3 with the second comparator waveform 217-2 to generate a second PWM waveform equivalent to the min_pulse waveform 214 at OUTN 222-2. For negative Vin, corresponding to the time-varying Vin 220 such that Vin_n 220-2 is above the common mode signal 212, the logic unit 218 combinatorial logic results in the second PWM waveform 310 at OUTN 222-2 having a duty cycle that increases from min_pulse to a new value based on the amplitude of the non-zero Vin 220. Whereas, for positive Vin, the logic unit 218 provides a second PWM waveform equivalent to the min_pulse waveform 214 at OUTP 222-2.

At block 414, the first PWM waveform and the second waveform are provided to a switching amplifier. For instance, in case of event 304, the modulation unit 102 applies the first PWM waveform 308 from block 410 and the second PWM waveform equivalent to 214 from block 412 to the switching amplifier 120 for differentially driving a peripheral device such as the speaker 122.

In one case, if a zero valued Vin 220 is applied, the min_pulse waveform 214 is obtained at both block 410 and 412. In a second case, for a positive non-zero Vin 220, the duty cycle of the first PWM waveform 308 increases to a duty cycle equivalent to a sum of min_pulse and a duty cycle value proportional to Vin_p 220-1. The second PWM waveform corresponding to the non-zero Vin_n 220-2 is the min_pulse waveform 214. Similarly, output waveforms are obtained for a negative non-zero Vin 220, where the first PWM waveform is the min_pulse waveform 214 and the second PWM waveform 310 has a time varying duty cycle. In all cases, reduced frequency pulling of the oscillator 118 is obtained thereby reducing RF interference. Additionally, the average differential output, such as DIFF 314 and DIFF 316, from the switching amplifier 120 remains the same as in conventional differential PWM schemes and hence, performance of the switching amplifier 120 is not compromised.

CONCLUSION

Although embodiments for pulse width modulation for switching amplifiers have been described in language specific to structural features and/or methods, it is to be understood that the appended claims are not necessarily limited to the specific features or methods described. Rather, the specific features and methods are disclosed as exemplary implementations for the pulse width modulation for switching amplifiers.

We claim:
1. A device comprising:
a sampling signal generator configured to generate a sampling signal; and
a modulation unit operatively coupled to the sampling signal generator, wherein the modulation unit is configured to:
receive differential input signals; and
generate differential pulse width modulated waveforms based on the sampling signal and the differential input signals, wherein at least one of the differential pulse width modulated waveforms has a duty cycle equivalent to a pre-determined non-zero minimum pulse width at all values of the differential input signals.

2. The device as claimed in claim 1, wherein the sampling signal has a base amplitude at a level lower than a common mode signal by a pre-determined non-zero minimum shift value.

3. The device as claimed in claim 2, wherein the pre-determined non-zero minimum shift value is based at least in part on the pre-determined non-zero minimum pulse width.

4. The device as claimed in claim 1, wherein the sampling signal generator is a self-oscillating ramp generator.

5. The device as claimed in claim 1, wherein the modulation unit comprises:
a comparator unit comprising:
a first comparator configured to compare a first one of the differential input signals with the sampling signal and provide a first comparator waveform;
a second comparator configured to compare a second one of the differential input signals with the sampling signal and provide a second comparator waveform; and
a third comparator configured to compare the sampling signal with a common mode signal and provide a min_pulse waveform; and
a logic unit comprising:
a first logic gate configured to provide a first pulse width modulated waveform based on the first comparator waveform and the min_pulse waveform; and
a second logic gate configured to provide a second pulse width modulated waveform based on the second comparator waveform and the min_pulse waveform.

6. The device as claimed in claim 1, wherein the modulation unit generates the pulse width modulated waveform having a duty cycle that varies in proportion to the differential input signals.

7. The device as claimed in claim 6, wherein a difference between the duty cycle of the pulse width modulated waveforms and a min_pulse waveform varies in proportion to the differential input signals.

8. The device as claimed in claim 1, wherein the differential pulse width modulated waveforms have a duty cycle equivalent to the pre-determined non-zero minimum pulse width for zero-valued differential input signals.

9. The device as claimed in claim 1, further comprising a switching amplifier, wherein the switching amplifier receives the differential pulse width modulated waveforms from the modulation unit.

10. The device as claimed in claim 9, wherein the switching amplifier is a class-D amplifier.

11. The device as claimed in claim 1, wherein the device is implemented in a communication device.

12. A method for implementing pulse width modulation comprising:
receiving a sampling signal and an input signal;
obtaining a min_pulse waveform based on a common mode signal and the sampling signal, wherein the min_pulse waveform is a pulse width modulated waveform having a duty cycle equivalent to a pre-determined non-zero minimum pulse width;
obtaining a first pulse width modulated waveform based on a first comparator waveform and the min_pulse waveform;
obtaining a second pulse width modulated waveform based on a second comparator waveform and the min_pulse waveform;
wherein at least one of the first and second pulse width modulated waveforms has a duty cycle equal to that of the min_pulse waveform at all values of the input signal; and
applying the first pulse width modulated waveform and the second pulse width modulated waveform to a peripheral device.

13. The method as claimed in claim 12, wherein the sampling signal has a saw-tooth waveform.

14. The method as claimed in claim 12, wherein the sampling signal has a triangular waveform.

15. The method as claimed in claim 12, further comprising:
obtaining the first comparator waveform based on a first differential input signal and the sampling signal; and
obtaining the second comparator waveform based on a second differential input signal and the sampling signal, wherein the input signal includes the first differential input signal and the second differential signal.

16. The method as claimed in claim 12, further comprising generating the sampling signal such that the sampling signal has a base amplitude at a level lower than the common mode signal by an amount equivalent to a pre-determined non-zero minimum shift value.

17. The method as claimed in claim 16, wherein the pre-determined non-zero minimum shift value is based at least in part on the pre-determined non-zero minimum pulse width.

18. The method as claimed in claim 16, wherein generating the sampling signal comprises:
flipping a classical sampling signal centered about the common mode signal such that the base amplitude of the flipped classical sampling signal is at a level of the common mode signal; and
shifting the flipped sampling signal below the common mode signal by a pre-determined non-zero minimum shift value such that the base amplitude is at a level below the common mode signal by the pre-determined non-zero minimum shift value.

19. The method as claimed in claim 12, wherein the pre-determined non-zero minimum pulse width is determined based at least in part on a bandwidth of at least one driver circuit of the peripheral device.

20. The method as claimed in claim 12, wherein the applying the first pulse width modulated waveform and the second pulse width modulated waveform to the peripheral device further comprises:
amplifying the first pulse width modulated waveform and the second pulse width modulated waveform to provide a first output signal and a second output signal respectively; and
applying the first output signal and the second output signal to differentially drive the peripheral device.

21. A modulation unit comprising:
a comparator unit configured to provide comparator waveforms based on differential input signals and a sampling signal; and
a logic unit configured to generate differential pulse width modulated waveforms based on the comparator waveforms, wherein the logic unit is configured to generate at least one differential pulse width waveform equivalent to a min_pulse waveform having a duty cycle equivalent to a pre-determined non-zero minimum pulse width at all values of the differential input signals.

22. The modulation unit as claimed in claim 21, wherein the comparator unit comprises:
a first comparator configured to compare a first differential input signal with the sampling signal and provide a first one of the comparator waveforms;

a second comparator configured to compare a second differential input signal with the sampling signal and provide a second one of the comparator waveforms; and a third comparator configured to compare the sampling signal with a common mode signal and provide a min_pulse waveform.

23. The modulation unit as claimed in claim 22, wherein the logic unit comprises:

a first logic gate configured to provide a first pulse width modulated waveform based on the first comparator waveform and the min_pulse waveform; and a second logic gate configured to provide a second pulse width modulated waveform based on the second comparator waveform and the min_pulse waveform.

* * * * *

UNITED STATES PATENT AND TRADEMARK OFFICE
CERTIFICATE OF CORRECTION

PATENT NO. : 8,841,950 B2  Page 1 of 1
APPLICATION NO. : 13/500575
DATED : September 23, 2014
INVENTOR(S) : Somayajula et al.

It is certified that error appears in the above-identified patent and that said Letters Patent is hereby corrected as shown below:

In the specification

In Column 7, Line 48, delete "sub-system 120" and insert -- sub-system 114 --, therefor.

In Column 10, Line 36, delete "signal 210" and insert -- signal 212 --, therefor.

In Column 11, Line 47, delete "OUTP 220-1" and insert -- OUTP 222-1 --, therefor.

In Column 11, Lines 60-61, delete "Vin_p 220-2" and insert -- Vin_p 220-1 --, therefor.

In Column 12, Lines 13-14, delete "duty in cycle of 75%. Whereas, accordance" and insert -- duty cycle of 75%. Whereas, in accordance --, therefor.

In Column 12, Line 45, delete "OUTP 220-2." and insert -- OUTP 222-1. --, therefor.

In Column 14, Line 21, delete "OUTP 222-2." and insert -- OUTP 222-1. --, therefor.

Signed and Sealed this
Fifteenth Day of March, 2016

Michelle K. Lee
*Director of the United States Patent and Trademark Office*